(12) United States Patent
Mohamadi

(10) Patent No.: US 7,728,784 B2
(45) Date of Patent: *Jun. 1, 2010

(54) ANALOG PHASE SHIFTER

(75) Inventor: Farrokh Mohamadi, Irvine, CA (US)

(73) Assignee: Tialinx, Inc., Irvine, CA (US)

( * ) Notice: Subject to any disclaimer, the term of this patent is extended or adjusted under 35 U.S.C. 154(b) by 753 days.

This patent is subject to a terminal disclaimer.

(21) Appl. No.: 11/535,928

(22) Filed: Sep. 27, 2006

(65) Prior Publication Data

US 2007/0194991 A1 Aug. 23, 2007

Related U.S. Application Data

(63) Continuation-in-part of application No. 11/182,344, filed on Jul. 15, 2005, now Pat. No. 7,321,339, which is a continuation-in-part of application No. 11/141,283, filed on May 31, 2005, now Pat. No. 7,312,763.

(60) Provisional application No. 60/721,204, filed on Sep. 28, 2005.

(51) Int. Cl.
*H01Q 21/00* (2006.01)
(52) U.S. Cl. .............................. 343/853; 343/700 MS; 333/24.1
(58) Field of Classification Search .......... 343/700 MS, 343/852, 853, 860; 333/24.1, 24, 25
See application file for complete search history.

(56) References Cited

U.S. PATENT DOCUMENTS

| 7,542,005 B2 * | 6/2009 | Mohamadi | 343/853 |
| 2007/0097010 A1 * | 5/2007 | Mohamadi | 343/795 |
| 2008/0252546 A1 * | 10/2008 | Mohamadi | 343/853 |

OTHER PUBLICATIONS

S. Bassagni, et al., A Distance Routing Effect Algorithm for Mobility (DREAM), Proc. Mobicom1998, Oct. 1998, pp. 76-84, Dallas, TX.

J. Liu, et al., "A Dual-Space Approach to Tracking and Sensor Management in Wireless Sensor Networks," proc. of the 11th ACM Intl. Workshop, Sep. 2002, pp. 131-139.

R. Pasand, et al., The Capacity of Asynchronous Mary Time Hopping PPM UWB Mutiple Access Communication Systems, IEEE, 2004, pp. 4745-4749.

N. August, R. Thirugnanam, and D. Ha, An Adaptive UWB Modulation Scheme for Optimization of Energy, BER, and Data Rate, TM3-2, IEEE, 2004, pp. 182-186.

H. Zirath, et al., Development of 60-GHz Front-End Circuits for a High-Data-Rate Communication System, IEEE, Oct. 2004, vol. 39, No. 10, pp. 1640-1647.

(Continued)

*Primary Examiner*—HoangAnh T Le
(74) *Attorney, Agent, or Firm*—Haynes & Boone, LLP.

(57) ABSTRACT

In one embodiment, an integrated phase shifter includes: a plurality of stages, wherein each stage comprises: a transistor amplifier configured to amplify a voltage signal received at an input node into an amplified voltage signal at an output node according to a gain, wherein the transistor amplifier is configured such that the gain is proportional to a bias signal; an integrated inductor loading the output node, wherein the gain of the transistor amplifier is also proportional to an inductance of the integrated inductor; and a varactor diode loading the output node, wherein the varactor diode has a variable capacitance responsive to a control voltage.

9 Claims, 17 Drawing Sheets

OTHER PUBLICATIONS

F. Mohamadi, A Proposed Completely Electronically Controlled Beamforming Technology for Coverage Enhancement, IEEE p. 802.15 Working Group, Mar. 2005, Atlanta, GA.

C. Goldsmith, T.H. Lin, B. Powers, W.R. We, and B. Norvell, Micromechanical Membrane Switches for Microwave Applications, 1995 IEEE MTT-S Dig., 91-94.

A. Malczewski, et al., X-band RF MEMS Phase Shifters for Phased Array Applications, IEEE Microwave and Guided Wave Letters, Dec. 1999, 517-519, vol. 9.

J. Hayden and G. Rebeiz, Very Low-Loss Distributed X-Band and Ka-band MEMS Phase Shifters Using Meta-Air-Metal Capacitors, IEEE Transactions, Jan. 2003, vol. 51 No 1.

F. Mohamadi, Wafer Scale Integration of Active Antenna Array, RF Design, Feb. 2005, pp. 48-64.

F. Mohamadi, Si Integration with Millimeter Wave Phased Array Antenna, RF Design, Feb. 2004, pp. 40-48.

F. Mohamadi, Critical Data Timing in Distributed Systems, Defense Electronics, May 2004, pp. 13-18.

B. Kleveland, et al., Exploiting CMOS Reverse Interconnect Scaling in Multigigahertz Amplifier and Oscillator Design, IEEE Journal of Solid-State Circuits, Oct. 2001, 1480-1488.

T. Shibata, E. Sano, Characterization of MIS Structure Coplanar Transmission Lines for Investigation of Signal Propagation in Integrated Circuits, IEEE, 1990, p. 881-890, vol. 38.

* cited by examiner

ANALOG PHASE SHIFTER

RELATED APPLICATIONS

This application is a continuation-in-part of U.S. application Ser. No. 11/182,344, filed Jul. 15, 2005 now U.S. Pat. No. 7,321,339, which in turn is a continuation-in-part of U.S. application Ser. No. 11/141,283, filed May 31, 2005 now U.S. Pat. No. 7,312,763. In addition, this application claims the benefit of U.S. Provisional Application No. 60/721,204, filed Sep. 28, 2005.

STATEMENT REGARDING FEDERALLY SPONSORED RESEARCH OR DEVELOPMENT

This invention was made with Government support under contract number FA9453-06-C-0037 awarded by the U.S. Air Force. The U.S. Air Force and DARPA have certain rights in this invention.

TECHNICAL FIELD

The present invention relates generally to phase shifters and more particularly to a discrete analog phase shifter.

BACKGROUND

Conventional beam forming systems are often cumbersome to manufacture. In particular, conventional beam forming antenna arrays require complicated feed structures and phase-shifters that are impractical to be implemented in a semiconductor-based design due to its cost, power consumption and deficiency in electrical characteristics such as insertion loss and quantization noise levels. In addition, such beam forming arrays make digital signal processing techniques cumbersome as the operating frequency is increased. In addition, at the higher data rates enabled by high frequency operation, multipath fading and cross-interference becomes a serious issue. Adaptive beam forming techniques are known to combat these problems. But adaptive beam forming for transmission at 10 GHz or higher frequencies requires massively parallel utilization of A/D and D/A converters.

A key element of beamforming systems is the design of the phase shifter, which is conventionally implemented using a monolithic microwave integrated circuit (MMIC). However, MMICs are costly and introduce a relatively high insertion loss. As a result, Micro-Electro-Mechanical-Systems (MEMS)-based phase shifters have been developed. However, MEMS-based phase shifters are not compatible with conventional semiconductor processes and integration with advanced RF and mixed-signal processing in a monolithic substrate.

Accordingly, there is a need in the art for improved phase shifters that are compatible with semiconductor manufacturing processes.

SUMMARY

In accordance with an aspect of the invention, an integrated phase shifter is provided that includes: a plurality of stages, wherein each stage includes: a transistor amplifier configured to amplify a voltage signal received at an input node into an amplified voltage signal at an output node according to a gain, wherein the transistor amplifier is configured such that the gain is proportional to a bias signal; an integrated inductor loading the output node, wherein the gain of the transistor amplifier is also proportional to an inductance of the integrated inductor; and a varactor diode loading the output node, wherein the varactor diode has a variable capacitance responsive to a control voltage.

In accordance with an aspect of the invention, a wafer-scale antenna module is provided that includes: a substrate, a plurality of antennas adjacent the substrate; and an RF feed network adjacent the substrate for transmitting RF signals to the plurality of antennas and for receiving RF signals from the plurality of antennas, the RF feed network coupling to a plurality of distributed phase shifters integrated with the substrate for phase-shifting the RF signals propagated through the RF feed network, wherein each distributed phase shifter includes at least one varactor.

The invention will be more fully understood upon consideration of the following detailed description, taken together with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
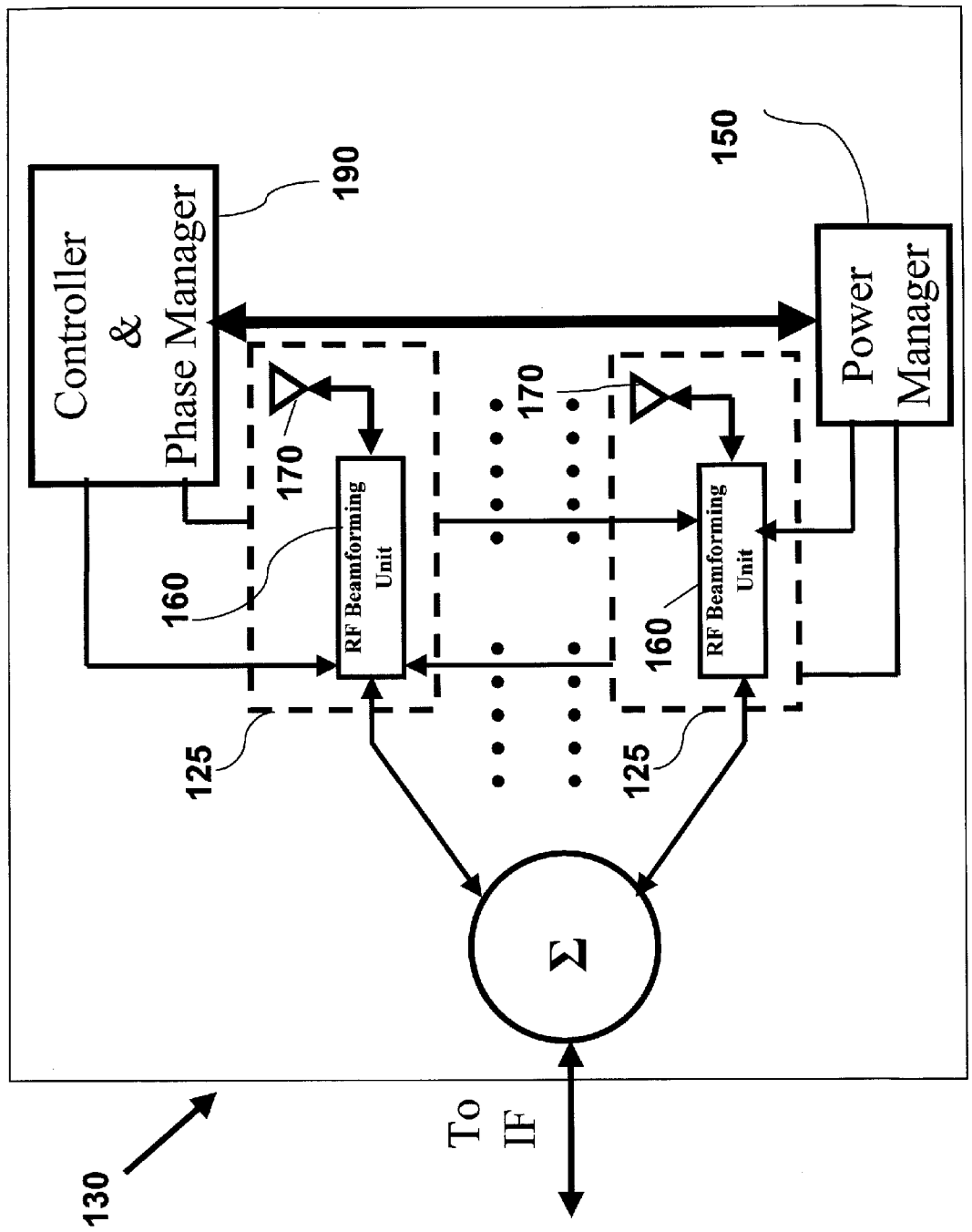
FIG. 1 is a block diagram of a beamforming antenna array in which the beamforming is performed in the RF domain.

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

The present invention provides a wafer scale antenna module with analog phase shifting capabilities. In this fashion, a controller may drive such a wafer scale antenna module with an analog control voltage such that any given antenna element transmits a sinusoid at any desired phase (360 degree analog selectivity). The analog phase shifting techniques discussed herein represent an enhancement of the distributed amplification and phase shifting techniques disclosed in U.S. application Ser. Nos. 11/141,283 and 11/182,344, the contents of which are incorporated by reference. An exemplary embodiment of the wafer scale beamforming approach disclosed in these applications may be better understood with regard to the beamforming system of FIG. 1, which illustrates an integrated RF beamforming and controller unit 130. In this embodiment, the receive and transmit antenna arrays are the same such that each antenna 170 functions to both transmit and receive. A plurality of integrated antenna circuits 125 each includes an RF beamforming interface circuit 160 and receive/transmit antenna 170. RF beamforming interface circuit 160 adjusts the phase and/or the amplitude of the received and transmitted RF signal responsive to control from a controller/phase manager circuit 190. Although illustrated having a one-to-one relationship between beamforming interface circuits 160 and antennas 170, it will be appreciated, however, that an integrated antenna circuit 125 may include a plurality of antennas all driven by RF beamforming interface circuit 160.

Figure 2:
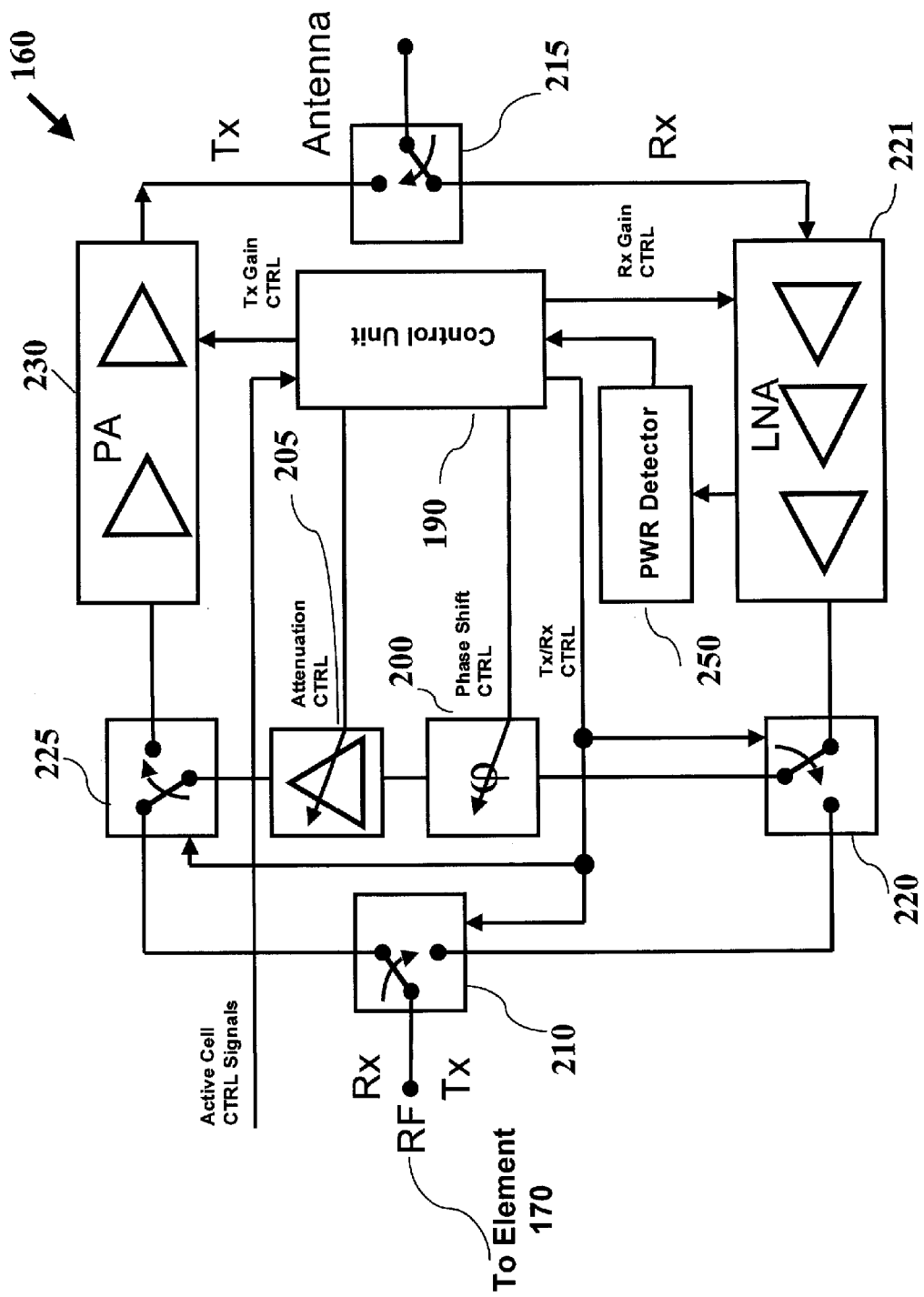
FIG. 2 is a schematic illustration of an RF beamforming interface circuit for the array of FIG. 1.

A circuit diagram for an exemplary embodiment of RF beamforming interface circuit 160 is shown in FIG. 2. Note that the beamforming performed by beamforming circuits 160 may be performed using either phase shifting, amplitude variation, or a combination of both phase shifting and amplitude variation. Accordingly, RF beamforming interface circuit 160 is shown including both a variable phase shifter 200 and a variable attenuator 205. It will be appreciated, however, that the inclusion of either phase shifter 200 or attenuator 205 will depend upon the type of beamforming being performed. To provide a compact design, RF beamforming circuit may include RF switches/multiplexers 210, 215, 220, and 225 so that phase shifter 200 and attenuator 205 may be used in either a receive or transmit configuration. For example, in a receive configuration RF switch 215 routes the received RF signal to a low noise amplifier 221. The resulting amplified signal is then routed by switch 220 to phase shifter 200 and/or attenuator 205. The phase shifting and/or attenuation provided by phase shifter 200 and attenuator 205 are under the control of controller/phase manager circuit 190. The resulting shifted signal routes through RF switch 225 to RF switch 210. RF switch 210 then routes the signal to IF processing circuitry (not illustrated).

In a transmit configuration, the RF signal received from IF processing circuitry (alternatively, a direct down-conversion architecture may be used to provide the RF signal) routes through RF switch 210 to RF switch 220, which in turn routes the RF signal to phase shifter 200 and/or attenuator 205. The resulting shifted signal is then routed through RF switch 225 to a power amplifier 230. The amplified RF signal then routes through RF switch 215 to antenna 170 (FIG. 1). It will be appreciated, however, that different configurations of switches may be implemented to provide this use of a single set of phase-shifter 200 and/or attenuator 205 in both the receive and transmit configuration. In addition, alternate embodiments of RF beamforming interface circuit 160 may be constructed not including switches 210, 220, and 225 such that the receive and transmit paths do not share phase shifter 200 and/or attenuator 205. In such embodiments, RF beamforming interface circuit 160 would include separate phase-shifters and/or attenuators for the receive and transmit paths.

To assist the beamforming capability, a power detector 250 functions as a received signal strength indicator to measure the power in the received RF signal. For example, power detector 250 may comprise a calibrated envelope detector. As seen in FIG. 1, a power manager 150 may detect the peak power determined by the various power detectors 250 within each integrated antenna circuit 125. The integrated antenna circuit 125 having the peak detected power may be denoted as the "master" integrated antenna circuit. Power manager 150 may then determine the relative delays for the envelopes for the RF signals from the remaining integrated antenna circuits 125 with respect to the envelope for the master integrated antenna circuit 125. To transmit in the same direction as this received RF signal, controller/phase manager 190 may determine the phases corresponding to these detected delays and command the transmitted phase shifts/attenuations accordingly. Alternatively, a desired receive or transmit beamforming direction may simply be commanded by controller/phase manager 190 rather than derived from a received signal. In such embodiment, power managers 150 and 250 need not be included since phasing information will not be derived from a received RF signal.

Regardless of whether integrated antenna circuits 125 perform their beamforming using phase shifting and/or amplitude variation, the shifting and/or variation is performed on the RF signal received either from the IF stage (in a transmit mode) or from its antenna 170 (in a receive mode). By performing the beamforming directly in the RF domain as discussed with respect to FIGS. 1 and 2, substantial savings are introduced over a system that performs its beamforming in the IF or baseband domain. Such IF or baseband systems must include A/D converters for each RF channel being processed. In contrast, the system shown in FIG. 1 may supply a combined RF signal from an adder 140. From an IF standpoint, it is just processing a single RF channel for the system of FIG. 1, thereby requiring just a single A/D. Accordingly, the following discussion will assume that the beamforming is performed in the RF domain. The injection of phase and/or attenuation control signals by controller/phase manager circuit 190 into each integrated antenna circuit 125 may be performed inductively as discussed in commonly-assigned U.S. Pat. No. 6,885,344.

Figure 3:
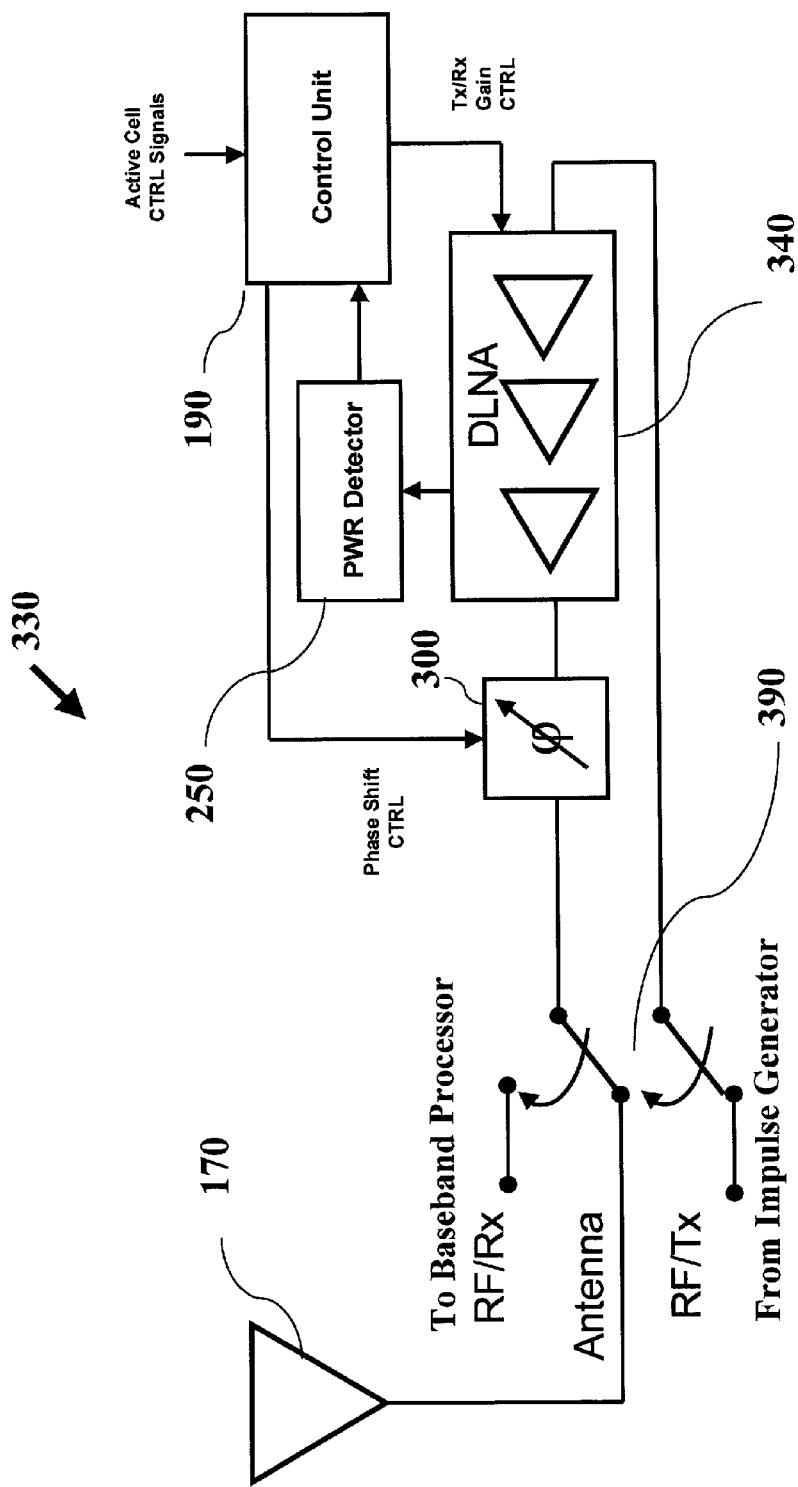
FIG. 3 is a high-level schematic illustration of an RF beamforming interface circuit including a distributed phase shifter and a distributed amplifier in accordance with an embodiment of the invention.

Referring now to FIG. 3, another exemplary embodiment of an RF beamforming interface circuit 160 is illustrated. In this embodiment, signals are distributed between a baseband processor and the antennas using a coplanar waveguide network 330, which may be either full-duplex or half-duplex. In the embodiment illustrated in FIG. 3, CPW network 330 is half-duplex. However, it will be appreciated that the full-duplex arrangement may also be used. To accommodate half-duplex transmission, RF switches 390 select for either a receiving or transmitting mode. In the transmitting mode, the baseband processor provides an RF signal to distributed low noise amplifier (DLNA) 340. In turn, DLNA 340 provides its amplified signal to a discrete phase shifter 300 so that the amplified signal may be phase shifted according to commands from control unit 190. In the receiving mode, RF switches 390 are configured so that a received RF signal from antenna 170 couples through DLNA 340 and phase shifter 300 to the baseband processor. As discussed earlier, a power detector 250 may be used to determine the "master" antenna based upon received power for beam steering purposes. The implementations of phase shifter 300 and DLNA 340 will be discussed further in greater detail.

Figure 4:
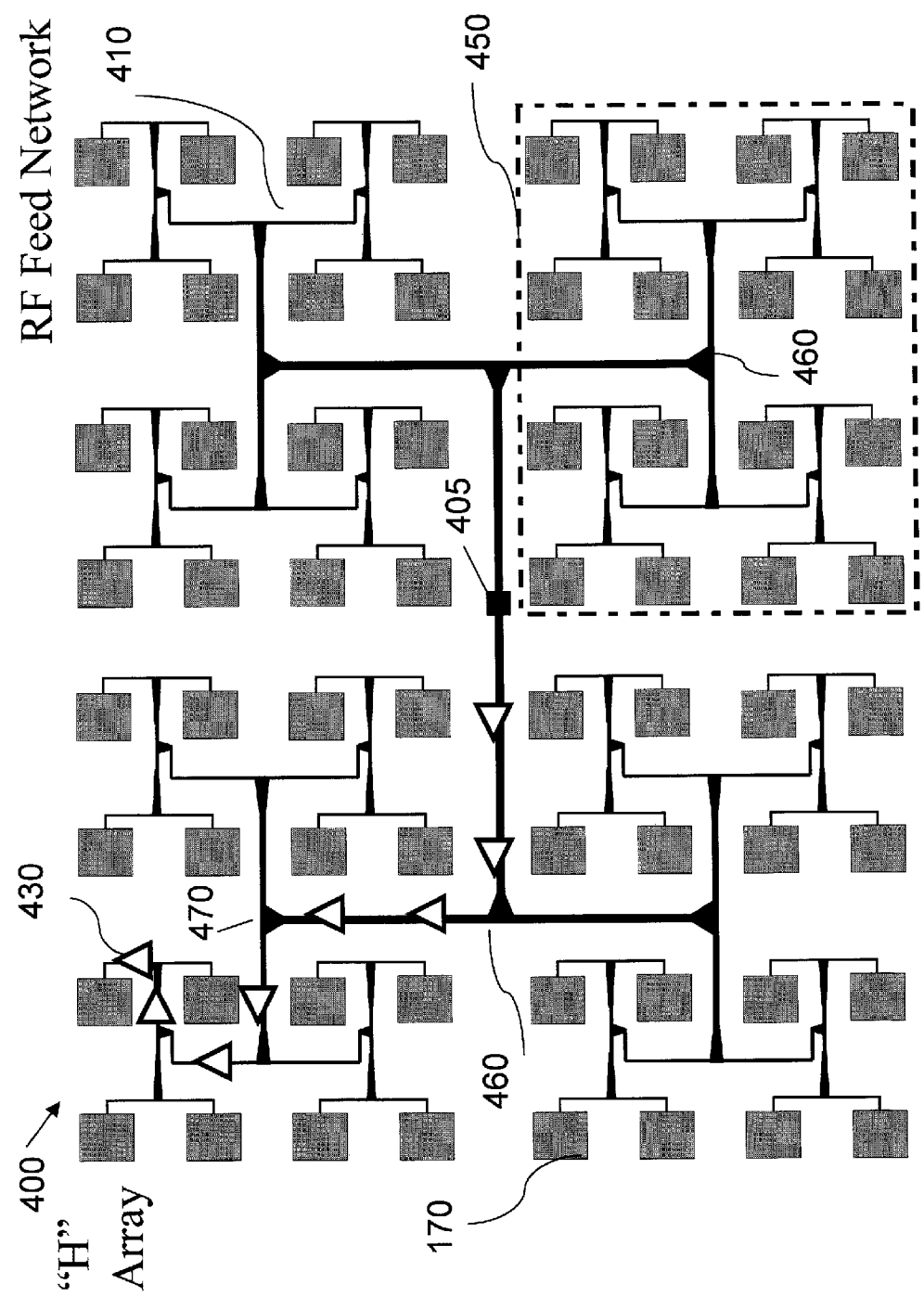
FIG. 4 is a plan view of a wafer scale beamforming antenna array module and its associated transmission network in accordance with an embodiment of the invention.
Figure 5:
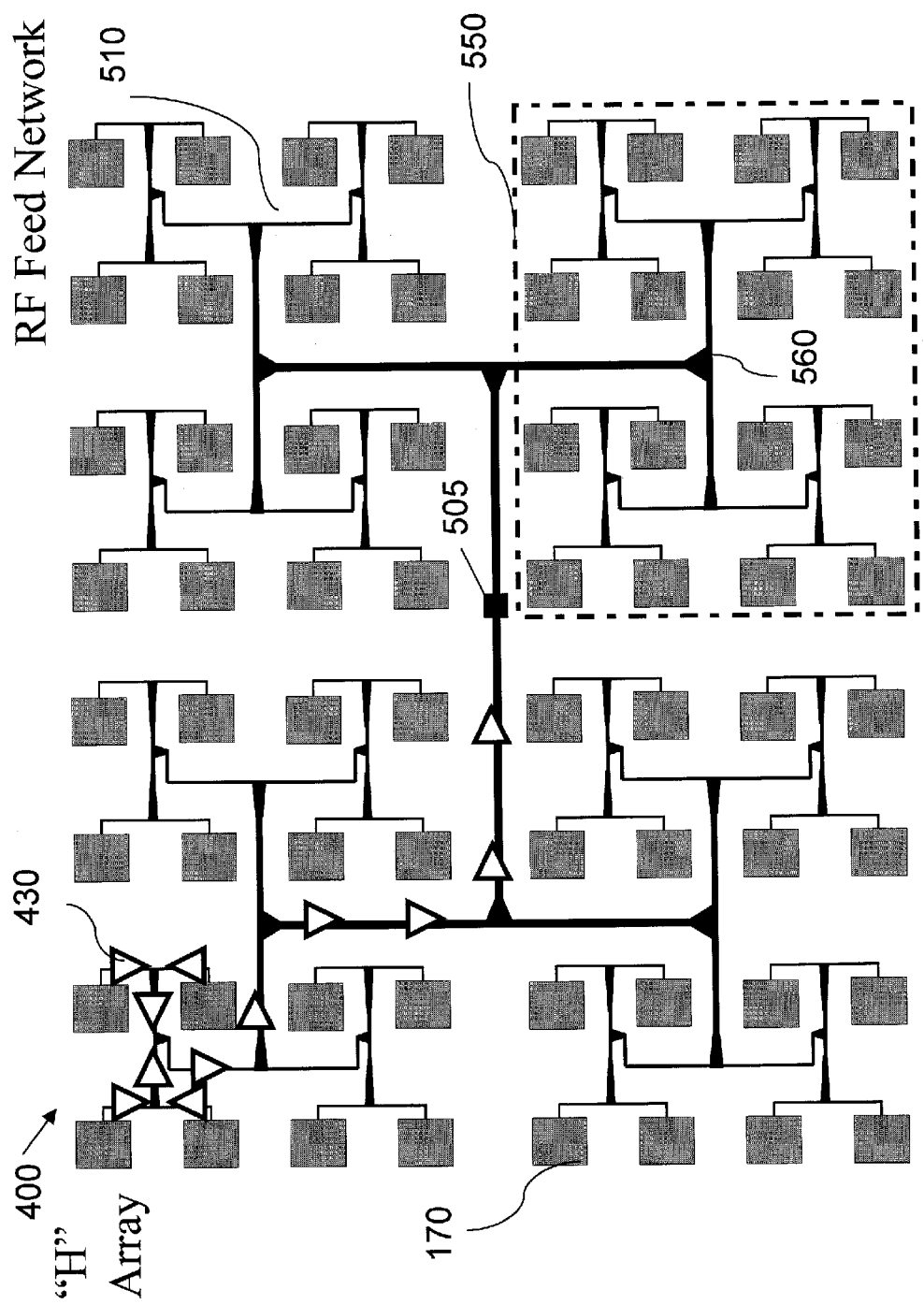
FIG. 5 is a plan view of a wafer scale beamforming antenna array module and its associated receiving network in accordance with an embodiment of the invention.

The CPW network and antennas may advantageously be implemented in a wafer scale antenna module. A view of an 8" wafer scale antenna module 400 having 64 antenna elements 170 is illustrated in FIGS. 4 and 5. A half-duplex transmission network 410 is illustrated in FIG. 4. From a center feed point 405, transmission network 410 couples to every antenna element 170. For such an array, the transmission distance from feed point 405 to any given antenna element may be approximately 120 mm, which is close to four wavelengths at 10 GHz. Should network 410 be implemented using CPW, the transmission losses can thus exceed 120 dB. Although the scope of the invention includes the use of any suitable architecture for network 410 such as CPW, microstrip, and planar waveguide, CPW enjoys superior shielding properties over microstrip. Thus, the following discussion will assume without loss of generality that network 410 is implemented using CPW. A half-duplex receiving CPW network 510 for wafer scale antenna module 400 having 64 antenna elements 170 is illustrated in FIG. 5.

The transmission network may be single-ended or differential. In one embodiment, the network may comprise a coplanar waveguide (CPW) having a conductor width of a few microns (e.g., 4 microns). With such a small width or pitch to the network, a first array of 64 antenna elements and a second array of 1024 antenna elements may be readily networked in an 8 inch wafer substrate for 10 GHz and 40 GHz operation, respectively. Alternatively, a wafer scale antenna module may be dedicated to a single frequency band of operation. The distributed low noise amplifiers will be described first, followed by a discussion of the discrete analog phase shifters.

Figure 6:
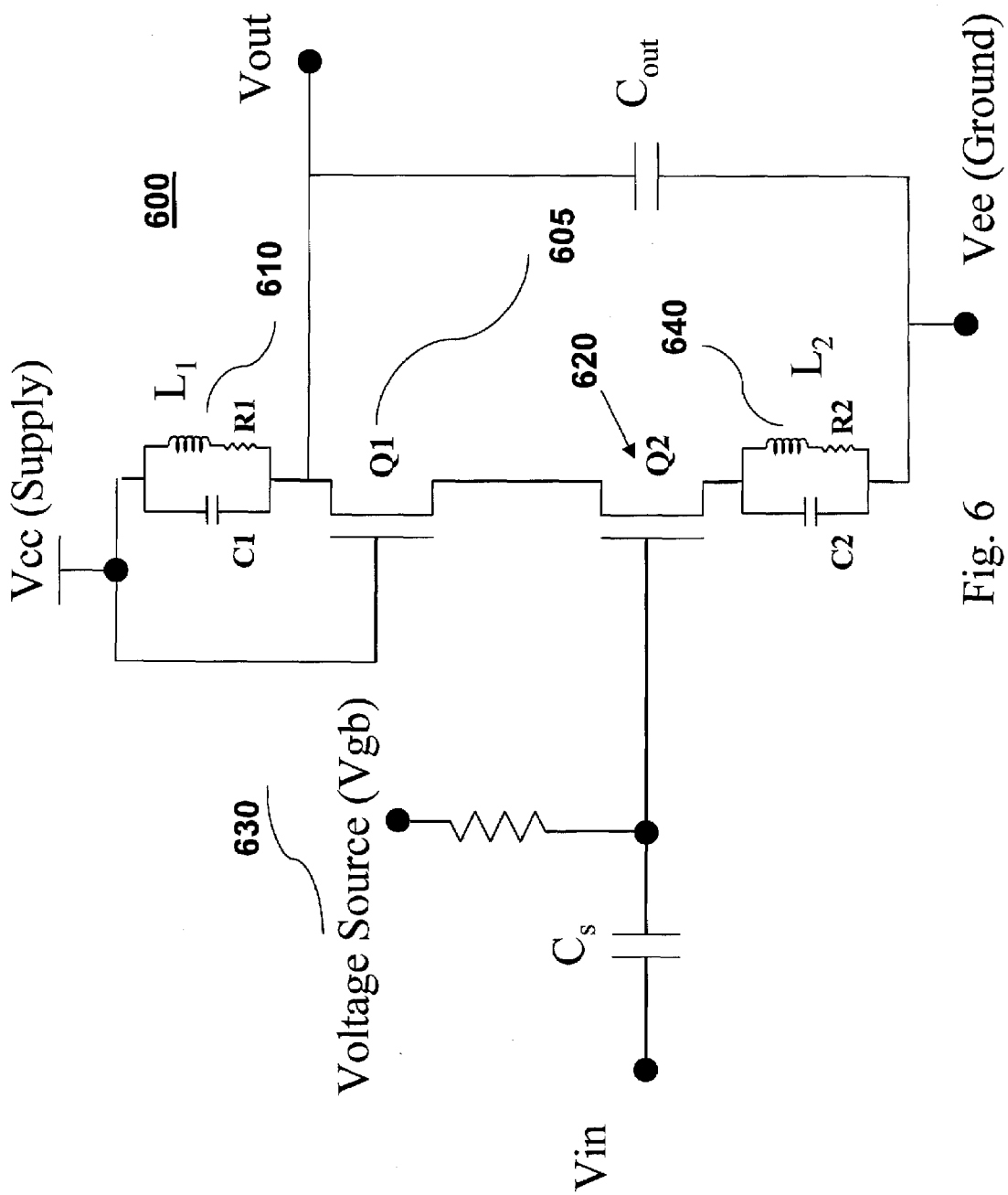
FIG. 6 is a schematic illustration of a matching amplifier in accordance with an embodiment of the invention.

In one embodiment, a driving amplifier in the network is followed by a matching amplifier for efficient performance. An exemplary embodiment of a FET-based matching amplifier 600 is illustrated in FIG. 6. Matching amplifier 600 couples to a coplanar waveguide network (not illustrated) at input port Vin and output port Vout. An analogous BJT-based architecture may also be implemented. The FETs may be either NMOS or PMOS. A first NMOS FET Q1 605 has its drain coupled through an integrated inductor (L1) 610 to a supply voltage Vcc. This integrated inductor L1 may be formed using metal layers in a semiconductor process as discussed in commonly-assigned U.S. Pat. No. 6,963,307. Because such an integrated inductor L1 will also have a stray capacitance and resistance, these stray effects are modeled by capacitor C1 and resistor R1. The metal layers in the semiconductor process may also be used to form a DC blocking capacitor $C_s$ and an output capacitor $C_{out}$. The supply voltage also biases the gate of Q1. Q1 has its drain driving Vout and its drain coupled to a second NMOS FET Q2 620. A voltage source 630 coupled through a high value resistor or configured transistor biases the gate of Q2 620 with a voltage Vgb. The source of Q2 620 couples to ground through an integrated inductor (L2) 640. Analogous to inductor 610, inductor 640 has its stray capacitance and resistance modeled by capacitor C2 and resistor R2. It may be shown that an input resistance Rin for amplifier 600 is as follows:

$Rin=(gm)*L2/Cgs$ where gm is the transconductance for Q2 620, L2 is the inductance of the inductor 640 and Cgs is the gate-source capacitance for Q2 620. Thus, Q2 620 and inductor 640 characterize the input impedance and may be readily designed to present a desired impedance. For example, if an input resistance of 50Ω is desired (to match a corresponding impedance of the CPW network), the channel dimensions for Q2 and dimensions for inductor 640 may be designed accordingly.

Figure 7A:
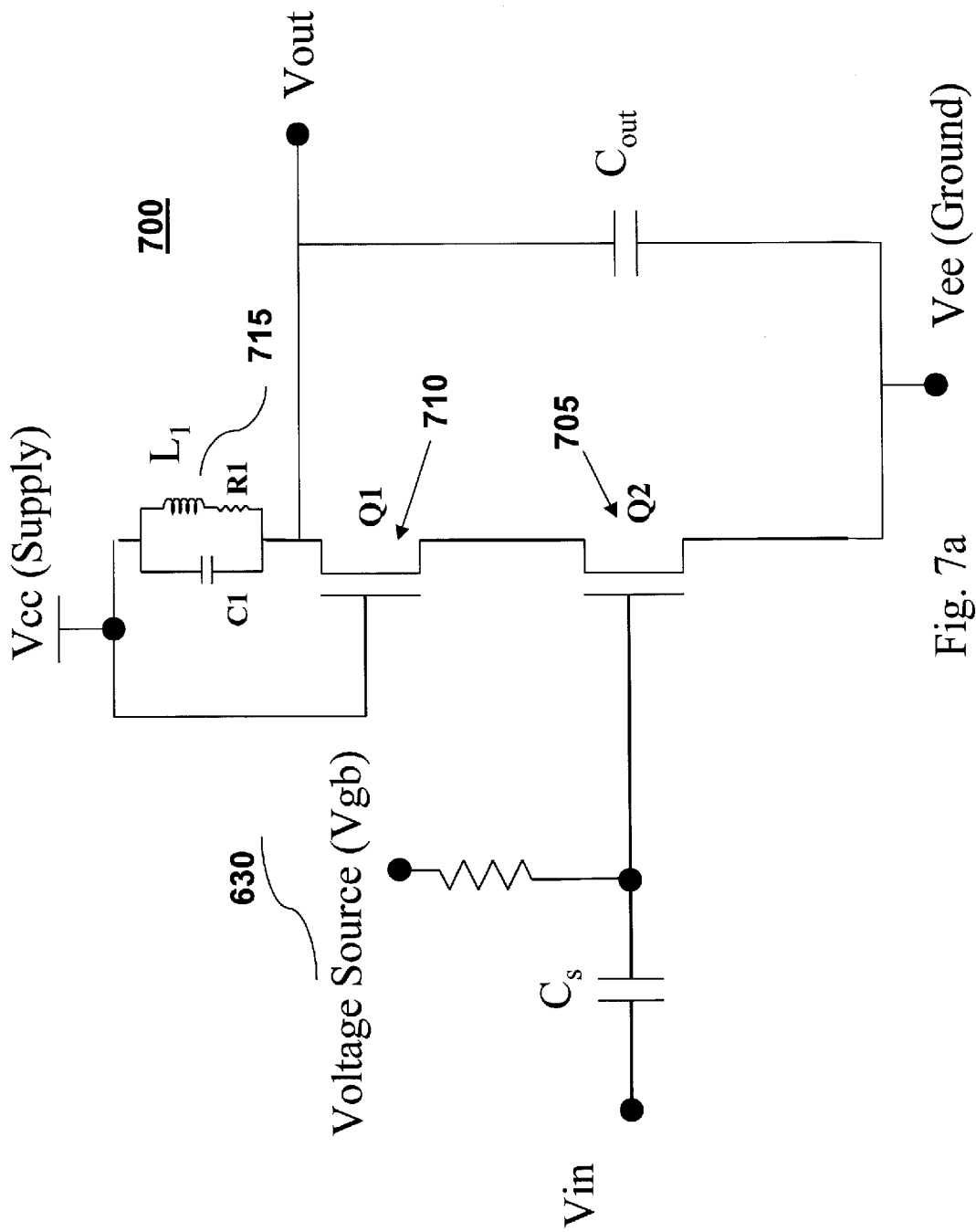
FIG. 7a is a schematic illustration of a driving amplifier for distributed amplification in accordance with an embodiment of the invention.

An exemplary driving amplifier 700 is illustrated in FIG. 7a. Driving amplifier 700 is constructed analogously to matching amplifier 600 except that no inductor loads the source of Q2 705. A transistor Q1 710 has its drain loaded with an integrated inductor 715 in a similar fashion as discussed with regard to Q1 605 of matching amplifier 600. Inductor 715 determines a center frequency Fd for driving amplifier 700 whereas both inductors 640 and 610 establish a resonant frequency Fm for matching amplifier 600. It may be shown that the band-pass center frequency Fc of a series-connected driving and matching amplifier is given as $Fc=\frac{1}{2}*sqrt(Fd^2+Fm^2)$ Referring back to FIG. 4, a series of driving amplifier/matching amplifier pairs 430 are shown coupling feed point 405 to a first network intersection 460. In such an "H" configured network array, network 410 will continue to branch from intersection 460 such as at an intersection 470. For a half-duplex embodiment, driving amplifier/matching amplifier pairs 430 may also be incorporated in receiving network as seen in FIG. 5. For illustration clarity, the distribution of the driving amplifier/matching amplifier pairs 430 is shown only in selected transmission paths in FIGS. 4 and 5. It will be appreciated that both the driving amplifiers and the matching amplifiers may be constructed using alternative arrangements of bipolar transistors such as PNP bipolar transistors or NPN bipolar transistors. In a bipolar embodiment, biasing voltage sources 630 are replaced by biasing current sources. In addition, the RF feed network and these amplifiers may be constructed in either a single ended or differential fashion. DC and control lines may be arranged orthogonally to the RF distribution direction for isolation. In addition, this same orthogonality may be maintained for the RF transmit and receive networks in a full duplex design.

Figure 8:
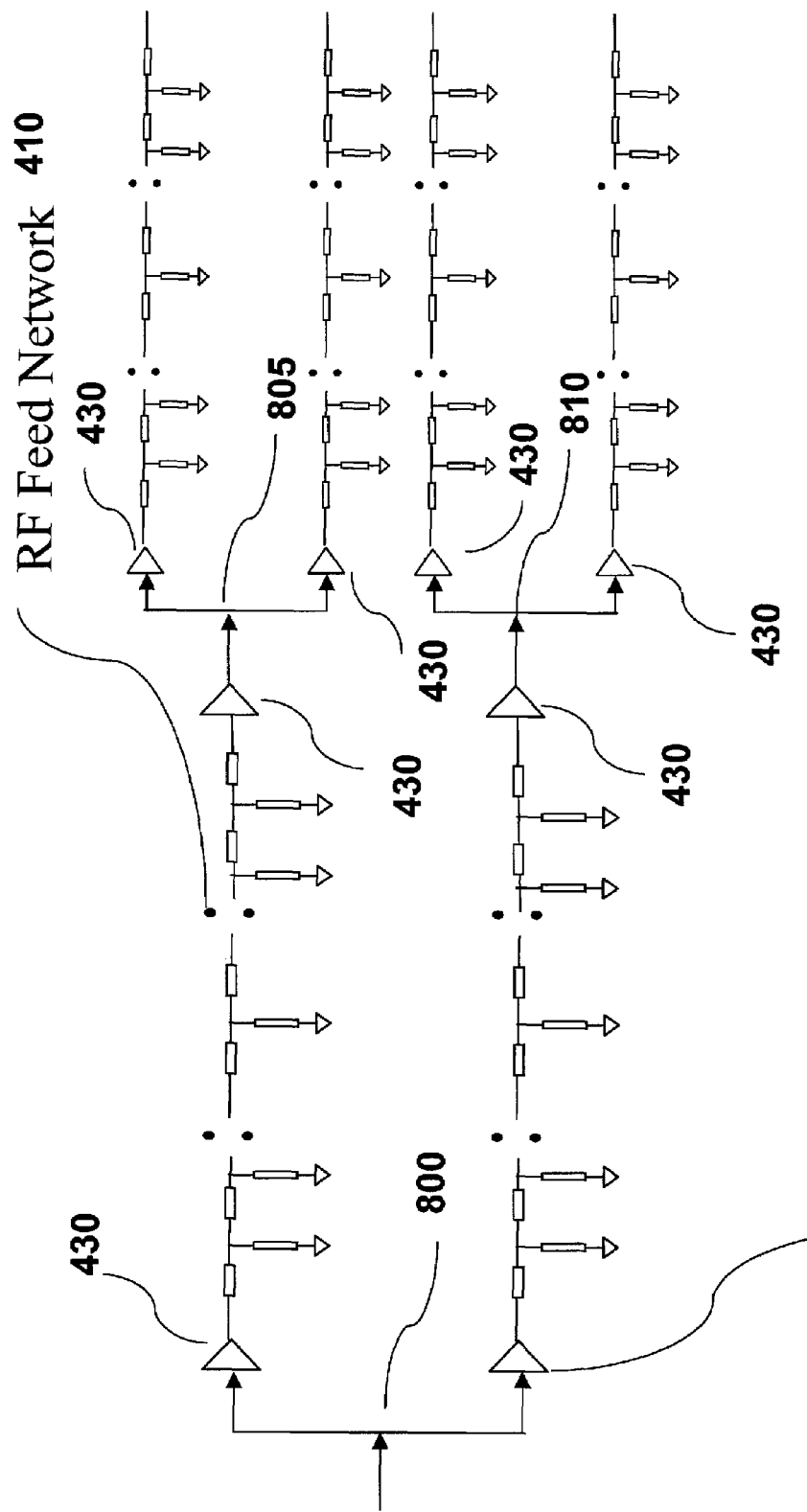
FIG. 8 illustrates a distributed amplification arrangement with respect to a splitting junction in accordance with an embodiment of the invention.

Turning now to FIG. 8, a single driving amplifier/matching amplifier pair 430 may both precede and follow network branching intersections 800, 805, and 810 in transmission network 410. Alternatively, just a single pair 430 may drive each branching intersection. It will be appreciated that the same considerations apply to a receiving (and hence combining) network. Indeed, the same network may be used for both transmission and reception in a half-duplex design. In a full duplex, separate transmit and receive RF feed networks should be used to avoid interference.

Figure 9:
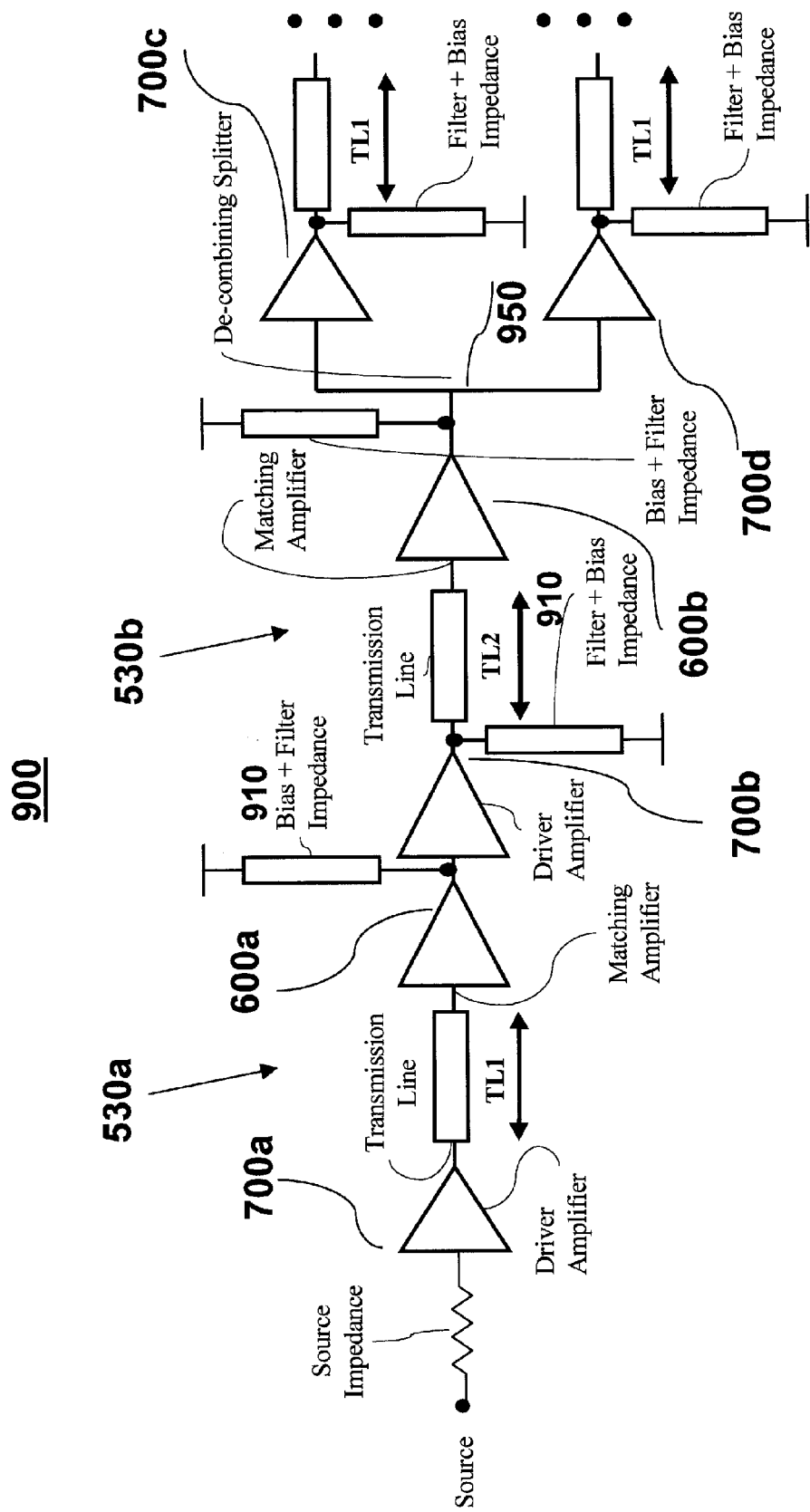
FIG. 9 illustrates a distributed amplification arrangement with respect to a splitting junction in accordance with an embodiment of the invention.

Network properties are influenced by the distance between driving amplifiers and matching amplifiers in successive driving amplifier/matching amplifier pairs. For example, as seen for RF network portion 900 in FIG. 9, its input or source is received at a first driver amplifier 700*a*, which drives a matching amplifier 600*a* separated from driver 700*a* by a length of network transmission line (such as coplanar waveguide) of length TL1. Driver amplifier 700*a* and matching amplifier 600*a* thus constitute a first driving amplifier/matching amplifier pair 530*a*, which may also be denoted as a load balanced amplifier (LBA). Matching amplifier 600*a* is immediately followed by a driver amplifier 700*b*, which couples to the output of matching amplifier 600*a* directly in the active circuitry silicon rather than through a transmission line section. In this fashion, die space on the wafer substrate is conserved. However, it will be appreciated that an RF network CPW transmission line segment could also be used to couple matching amplifier 600*a* to driving amplifier 700*b*. Driver amplifier 700*b* drives a matching amplifier 600*b* separated from driver 700*b* by a length TL2 of network transmission line. Driver amplifier 700*b* and matching amplifier 600*b* thus form a second driving amplifier/matching amplifier 530*b*. The necessary biasing and inductance loading as described with respect to FIGS. 6 and 7*a* are represented by bias and filter impedances 910. In general, the sum of TL1 and TL2 should equal one half of the center frequency wavelength. By changing the ratio of TL1/TL2 and the output capacitance, a maximum stable gain of approximately 20 to 30 dB may be obtained for 10 GHz to, for example, 40 GHz operation. In a 10 GHz embodiment, stable gain and frequency performance may be realized for a capacitance load of 50 fF as TL1/TL2 is varied from 40% to 80%.

In prior art RF distribution networks splitting and combining signals was problematic and involved cumbersome combiner or splitter circuitry. However, note the simplicity involved for the coupling of matching amplifier 600*b* through a splitting junction 950 to driver amplifiers 700*c* and 700*d*. This coupling occurs through a node in the active circuitry substrate to conserve wafer substrate area. However, this substrate coupling may be replaced by a CPW transmission line segment in alternative embodiments. As compared to prior art splitters, not only is there no loss coupling through splitting junction 950, but there is a gain instead. Moreover, transmission through the RF feed network is low loss and low noise because the driver and matching amplifiers are tuned with reactive components only—no resistive tuning (and hence loss) need be implemented.

Figure 10:
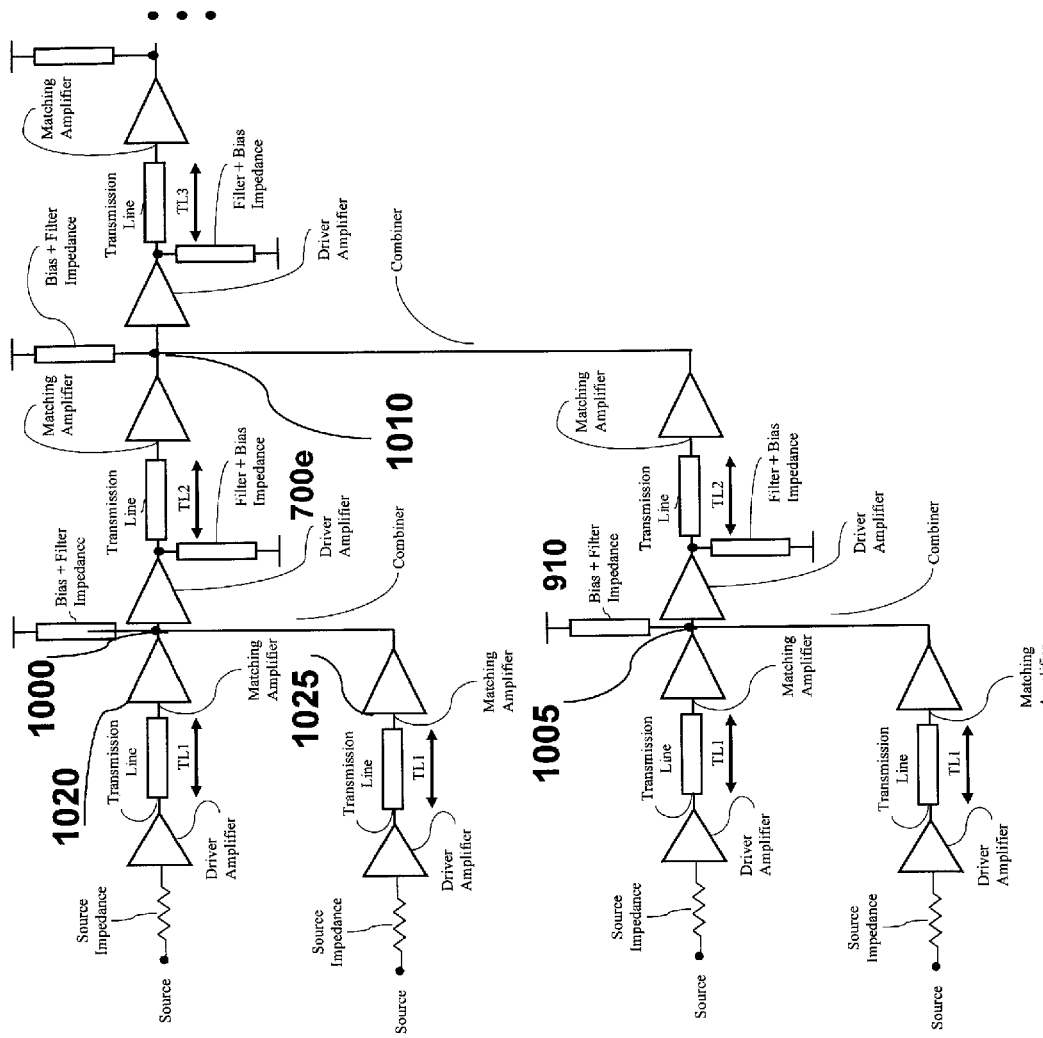
FIG. 10 illustrates a distributed amplification arrangement with respect to a combining junction in accordance with an embodiment of the invention.

The same low loss and simplicity of design advantages are present with respect to combining junction 1000, 1005, and 1010 as seen in FIG. 10. For example, with respect to junction 1000, two combiner matching amplifiers 1020 and 1025 (discussed further with regard to FIG. 11*a*) couple through a node in the active circuitry substrate to a driving amplifier 700*e* to conserve wafer substrate area. However, it will be appreciated that a CPW transmission line segment may be used to perform this coupling in alternative embodiments. Bias and filter impedance 910 is thus shared by both combiner matching amplifiers.

Figure 11A:
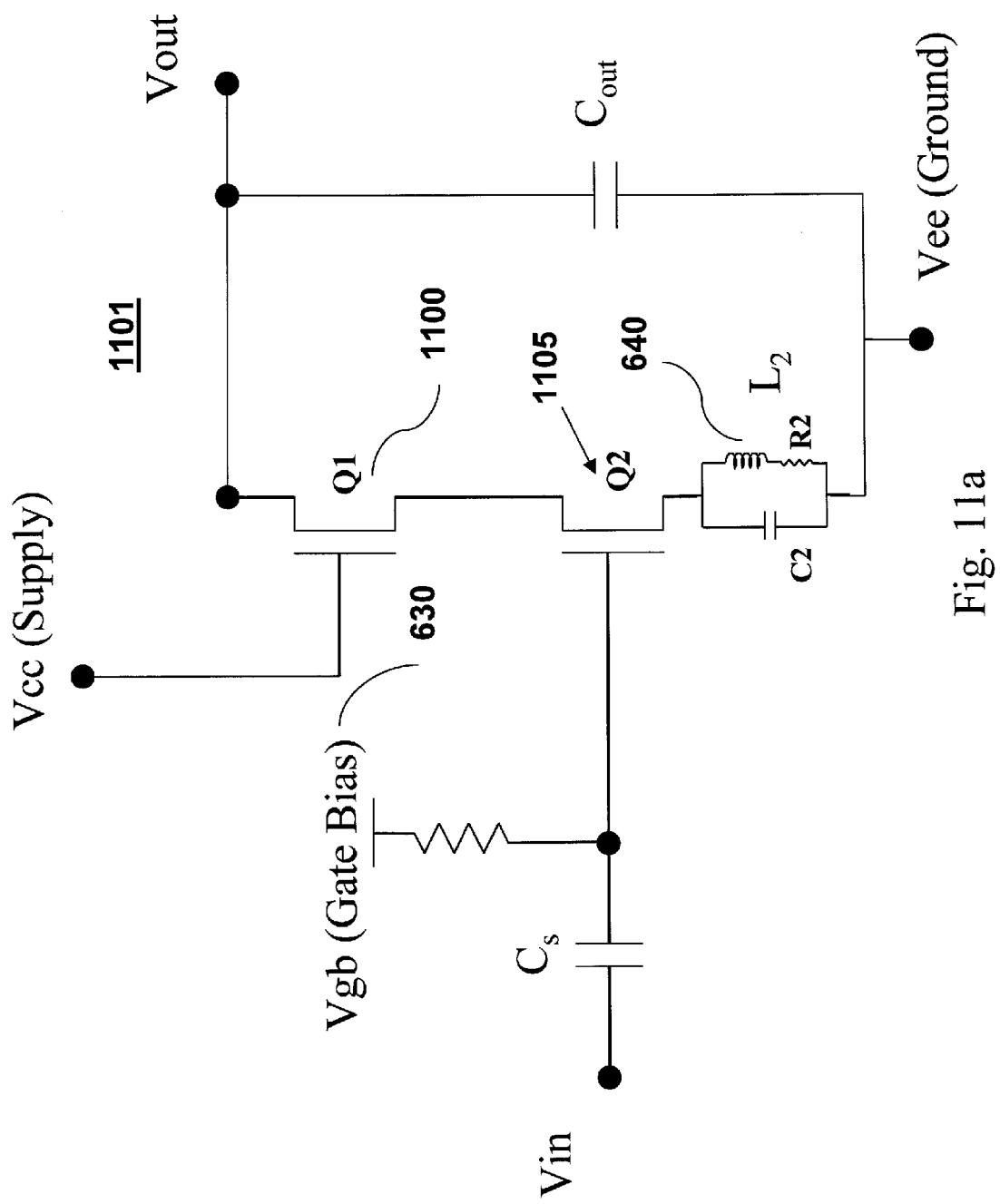
FIG. 11a is a schematic illustration of a matching amplifier for a combining junction used in distributed amplification in accordance with an embodiment of the invention.
Figure 11B:
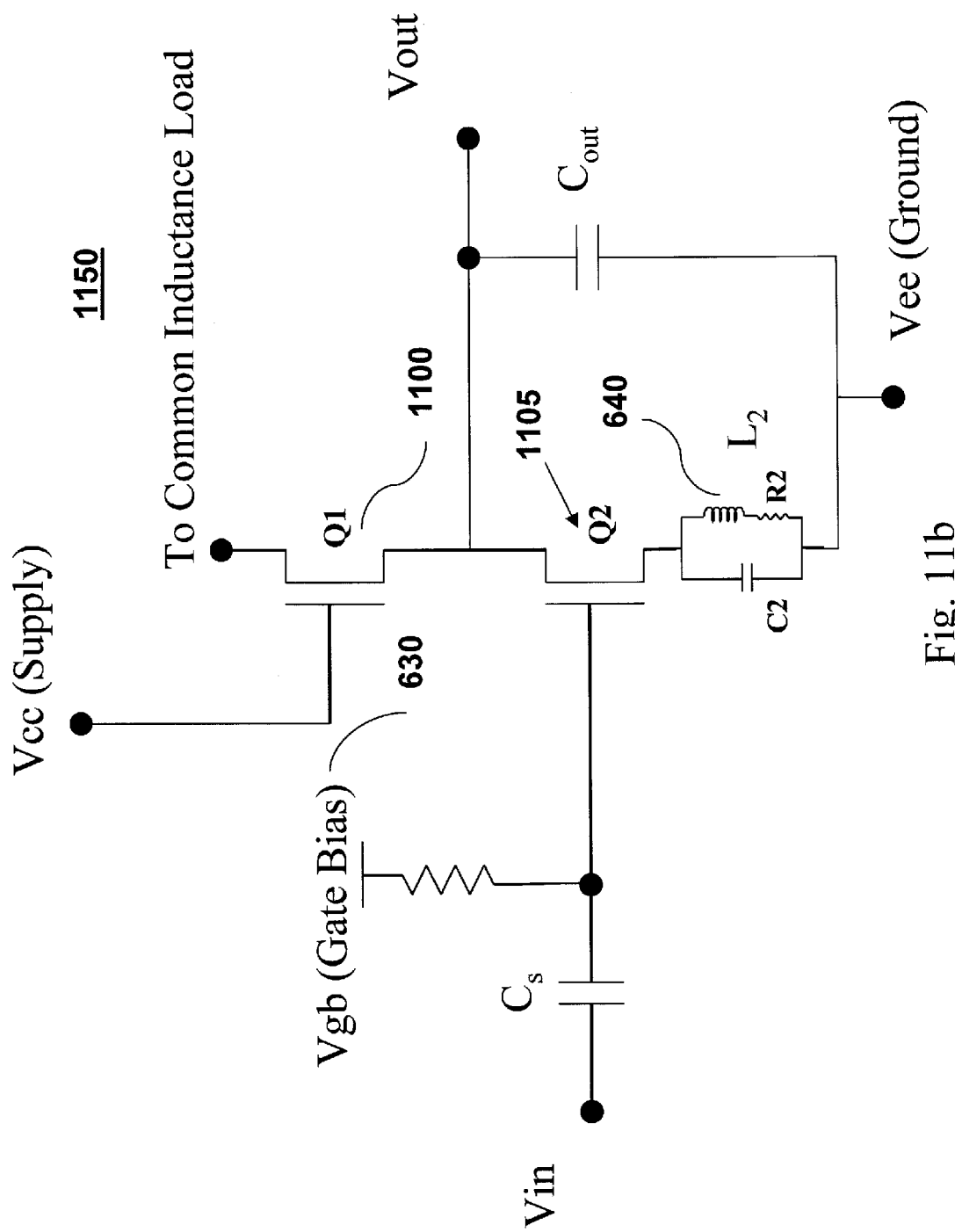
FIG. 11b is a schematic illustration of a matching amplifier for a pulse shaping circuit in accordance with an embodiment of the invention.

Turning now to FIG. 11*a*, a combiner matching amplifier 1101 is distinguished from a non-combiner matching amplifier such as discussed with respect to FIG. 6 by the absence of L1 at the drain of a FET Q1 1100. A FET Q2 1105 has its drain loaded by the matching inductor 640 for impedance matching as discussed with respect to FIG. 6. A common load inductor (not illustrated) couples to output node Vout to uniformly load all the involved combiner matching amplifiers.

The integration of the CPW network and the distributed amplification into a wafer scale integrated antenna module (WSAM) may be better understood by classifying the WSAM into three layers. The first layer would be a semiconductor substrate, such as silicon. On a first surface of the substrate, antennas such as patches for the integrated antenna circuits are formed as discussed, for example, in U.S. Pat. No. 6,870,503, the contents of which are incorporated by reference herein. Active circuitry for the corresponding integrated antenna circuits that drive these antennas are formed on a second opposing surface of the substrate. The CPW transmission network is formed adjacent this second opposing surface. The second layer would include the antennas on the first side of the substrate whereas the third layer would include the CPW network. Thus, such a WSAM includes the "back side" feature disclosed in U.S. Ser. No. 10/942,383, the contents of which are incorporated by reference, in that the active circuitry and the antennas are separated on either side of the substrate. In this fashion, electrical isolation between the active circuitry and the antenna elements is enhanced. Moreover, the ability to couple signals to and from the active circuitry is also enhanced. As discussed in U.S. Ser. No. 10/942,383, a heavily doped deep conductive junction through the substrate couples the active circuitry to vias/rods at the first substrate surface that in turn couple to the antenna elements. Formation of the junctions is similar to a deep diffusion junction process used for the manufacturing of double diffused CMOS (DMOS) or high voltage devices. It provides a region of low resistive signal path to minimize insertion loss to the antenna elements.

Upon formation of the junctions in the substrate, the active circuitry may be formed using standard semiconductor processes. The active circuitry may then be passivated by applying a low temperature deposited porous SiOx and a thin layer of nitridized oxide ($Si_xO_yN_z$) as a final layer of passivation. The thickness of these sealing layers may range from a fraction of a micron to a few microns. The opposing second surface may then be coated with a thermally conductive material and taped to a plastic adhesive holder to flip the substrate to expose the first surface. The substrate may then be back ground to reduce its thickness to a few hundreds of micrometers.

An electric shield may then be sputtered or alternatively coated using conductive paints on background surface. A shield layer over the electric field may form a reflective plane for directivity and also shields the antenna elements. In addition, parts of the shield form ohmic contacts to the junctions. For example, metallic lumps may be deposited on the junctions. These lumps ease penetration of the via/rods to form ohmic contacts with the active circuitry.

Figure 12:
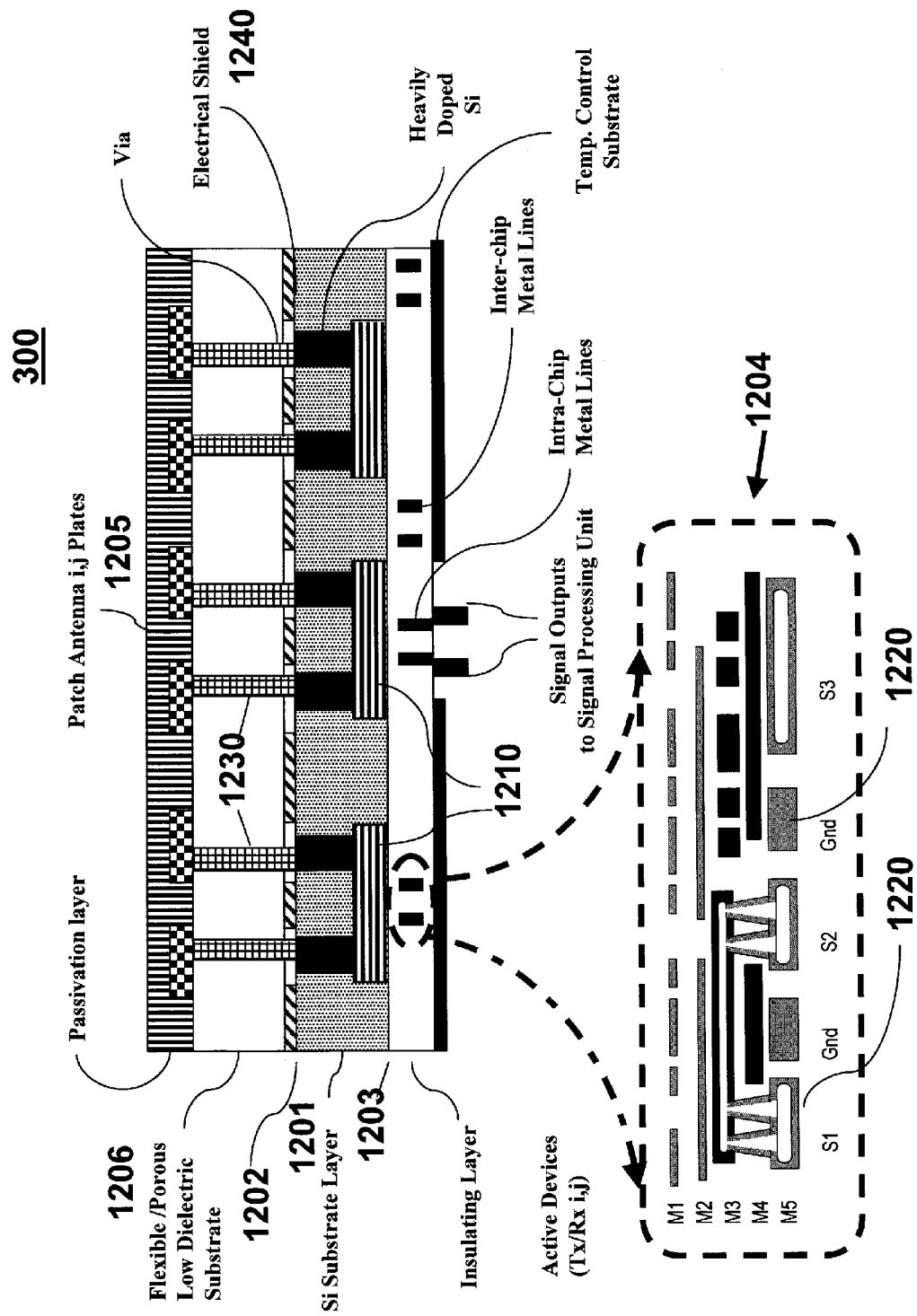
FIG. 12 is a cross-sectional view of an integrated antenna circuit having a coplanar waveguide RF feed network in accordance with an embodiment of the invention.

In an alternative embodiment, the CPW network may be integrated on the antenna side of the substrate. Because the backside approach has the isolation and coupling advantages described previously, the following discussion will assume without loss of generality that the RF feed network is integrated with the substrate in a backside embodiment. For example as seen in cross-section in FIG. 12, a semiconductor substrate 1201 has opposing surfaces 1202 and 1203. Antenna elements 1205 such as patches are formed on a dielectric layer 1206 adjacent to surface 1202. Active circuitry 1210 integrated with substrate 301 includes the driving and matching amplifiers for an RF feed network 1204 having CPW conductors S1 and S2. Adjacent surface 303, metal layer M1 includes inter-chip and other signal lines. Metal layer M2 forms, among other things, a ground plane for CPW conductors S1 and S2, which are formed in metal layer 5 as well as ground plates 1220. Metal layer M4 provides a connecting layer to couple CPW conductors together as necessary. The driving and matching amplifiers within active circuitry 1210 couple through vias (not illustrated) in apertures in the ground plane in metal layer M2 to CPW conductors S1 and S2. This active circuitry may also drive antennas 1205 through a plurality of vias 1230 that extend through the dielectric layer. An electric shield layer 1240 isolates the dielectric layer from surface 1202 of the substrate. The antennas may be protected from the elements and matched to free space through a passivation layer.

Figure 13:
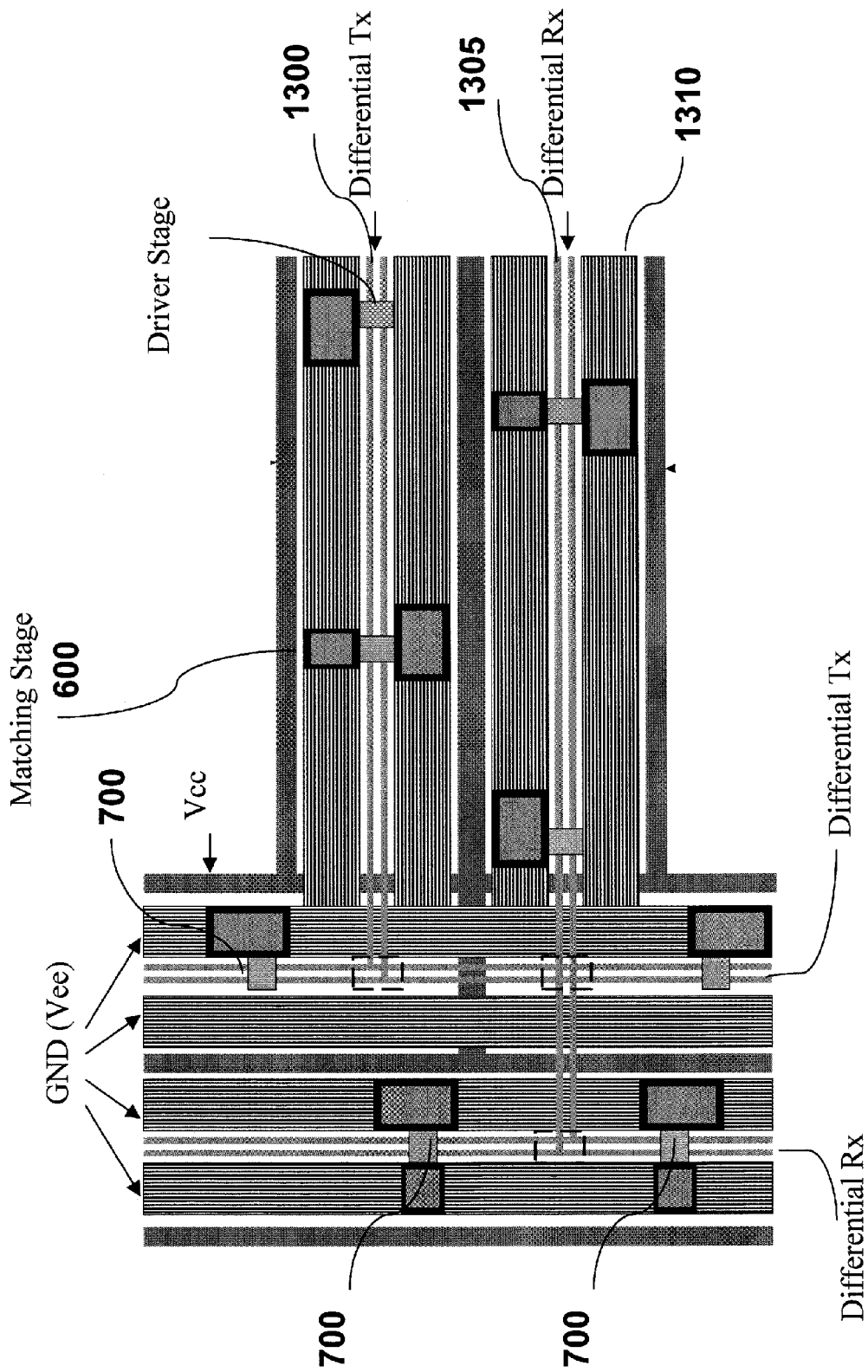
FIG. 13 is a plan view of a portion of the coplanar waveguide RF feed network of FIG. 12.

A layout view for a section of RF feed network with respect towards surface 1203 of the substrate shown is illustrated in FIG. 13. In this embodiment, the RF feed network is differential having separate differential transmission coplanar waveguides 1300 and differential receiving coplanar waveguides 1305. For enhanced process quality, the corresponding ground plates 1310 for the waveguides are formed from separate conductive lines rather than solid plates. Driver amplifiers 700 and matching amplifiers 600 are integrated into the substrate (not illustrated) and couple through vias (not illustrated) to the ground plate and the waveguides.

Just as active circuitry is distributed across the CPW network for amplification (using, e.g., the matching and driving amplifiers discussed previously), active circuitry may also be used to form distributed phase shifters as will be explained further herein. The location of the distributed phase shifters depends upon the granularity desired for the beam steering capability. For example, referring back to FIGS. 4 and 5, each antenna element 170 could receive individual phase shifting through an adjacent and corresponding distributed phase shifter. To save costs and reduce power consumption, subsets of antenna elements 170 may share in the phase shifting provided by a corresponding distributed phase shifter. For example, consider a subset 450 or 550 having sixteen antenna elements 170. As seen in FIG. 4, a distributed phase shifter located adjacent an intersection 460 of network 410 would provide equal phase shifting for each of the elements within subset 450. Similar subsets would have their own distributed phase shifter. Similarly, as seen in FIG. 5, a distributed phase shifter located adjacent an intersection 560 of network 510 would provide equal phase shifting for each of the elements within subset 550 with respected a received RF signal. Thus, it may be appreciated that the granularity of the beam steering capability is a design choice and depends upon desired manufacturing costs and associated complexity.

Figure 7B:
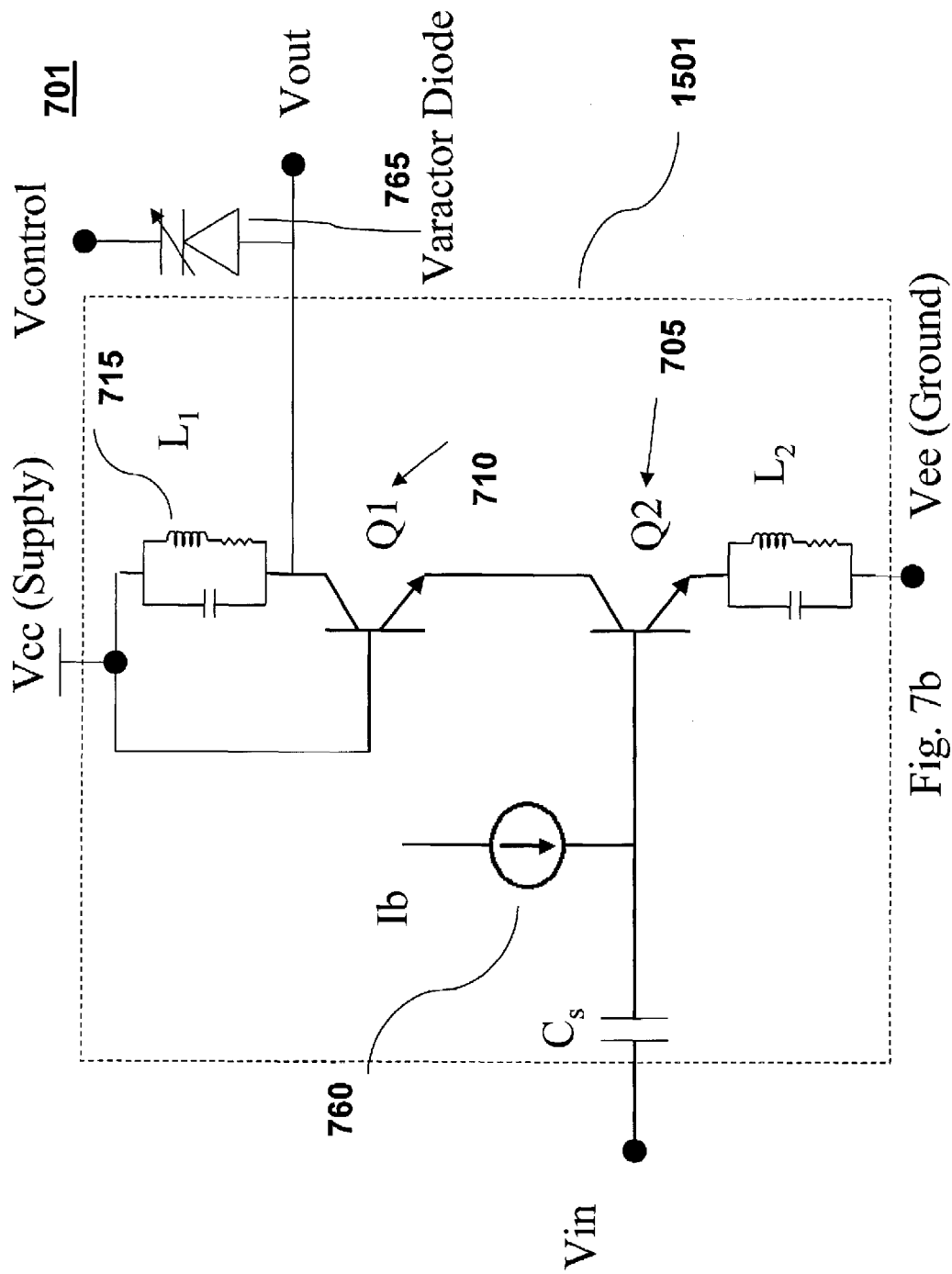
FIG. 7b is a schematic illustration of a driving amplifier/variable capacitor stage for a distributed variable capacitor array phase shifter (VCAPS) in accordance with an embodiment of the invention.

An advantageous analog phase shift may be achieved in a distributed phase shifter at relatively constant gain using a variable capacitor array phase shifter (VCAPS) as follows. Each distributed VCAPS may use one or more driver amplifiers/variable capacitor stages where stage includes a modified driver amplifier. This modified driver amplifier has the output capacitor discussed with regard to FIG. 7a replaced by a varactor. A bipolar-based VCAPS stage 701 is illustrated in FIG. 7b. As discussed analogously with regard to driver amplifier 700, VCAPS stage 701 includes a DC blocking capacitor CS between the base of BJT transistor Q2 and an input voltage node Vin. In addition, the base of Q2 is biased by a current source 760 that provides a bias current $I_b$. As discussed with regard to matching amplifier 600, the gain of VCAPS stage 701 is proportional to the inductance of an integrated inductor L1 that loads an output node Vout. The collector of BJT Q2 couples to an emitter of a BJT Q1 whose collector couples to the loaded output node Vout. An optional integrated inductor L2 loads the collector of BJT Q2. Typically, the inductance of L2 should be a fraction to approximately $1/10^{th}$ that of L1. Integrated inductor L2 functions to better match stage 701 so as to reduce reflected energy back through input node Vin. In addition to being loaded by the integrated inductor L1, the output node is also loaded by a varactor diode 765. Each varactor diode may be implemented using a PIN diode, n+/p−, or p+/n−, or MOS variable capacitor. A control voltage Vcontrol controls the capacitance of the varactor diode.

Figure 14:
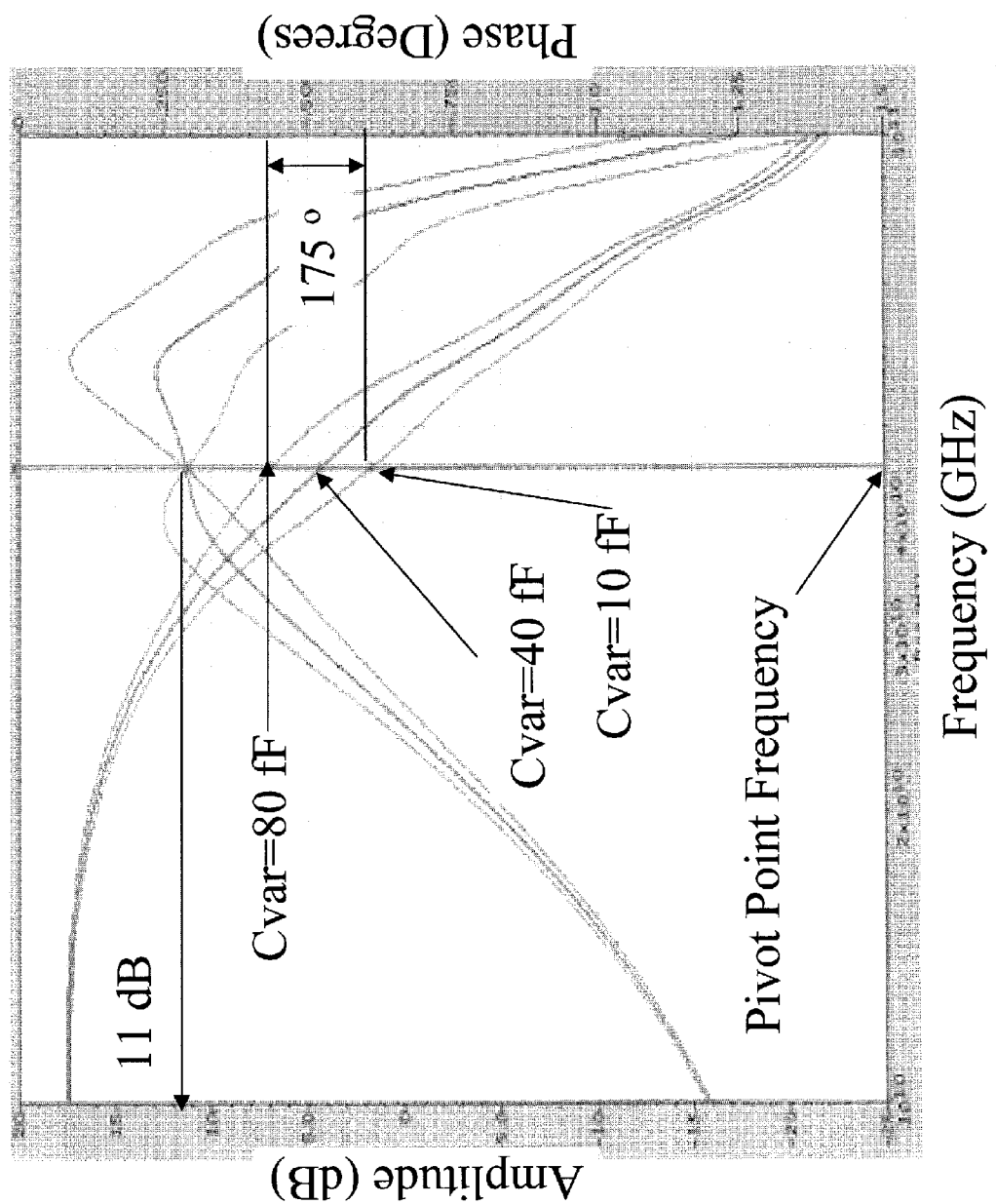
FIG. 14 illustrates the gain and phase behavior of the driving amplifier/variable capacitor stage of FIG. 7b for a variety of varactor capacitance values.

VCAPS stage 701 takes advantage of the following remarkable phase and gain variation. For example, the variation of phase shift and gain between input node Vin and output node Vout of VCAPS stage 701 as a function of the input frequency for an input voltage Vin driving the input voltage node is illustrated in FIG. 14 for varactor capacitances of 10, 40, and 80 fF and an inductance for L1 of 600 pH. It may be seen that at 45 GHz, the variation of phase is pronounced—175 degree variation between varactor capacitances of 10 and 80 fF yet the gain is substantially constant at approximately 11 dB. By changing the bias current Ib and the inductance of L1 appropriately, it will be appreciated that such a "pivot point" maximal-phase-shift-yet-constant-gain performance may achieved for any desired frequency.

Stage 701 may thus be seen to comprise a linear transistor amplifier 1501 having an output node loaded by an integrated inductor and a diode varactor. The gain of the linear transistor amplifier is proportional to the inductance of the integrated inductor whereas the phase shift of a signal propagated through the linear transistor amplifier is proportional to a control voltage applied to the diode varactor. The control voltage is varied to provide the desired phase lag through the linear transistor amplifier. The gain of the linear transistor amplifier is also proportional to a bias signal. In a BJT-based embodiment, the bias signal comprises the bias current Ib whereas in a FET-based embodiment, the bias signal comprises a bias voltage Vgb as discussed analogously with regard to FIG. 7a. Although a substantially constant gain performance is achieved if the signal frequency is maintained at the pivot point frequency despite variation of the varactor diode capacitance, there will always be some gain variation as Vcontrol is changed. Thus, the bias signal (Ib or Vgs, for example) may be changed in concert with a change in Vcontrol such that a constant gain performance is substantially achieved. Referring again to FIG. 14, it may be seen that the control of the bias signal so as to maintain constant gain will be simplest if the frequency of operation is maintained at the pivot point frequency. However, it will be appreciated that the VCAPS stages may be driven at non-pivot point frequencies and still achieve the linear and analog phase variation offered by the present invention.

Figure 15:
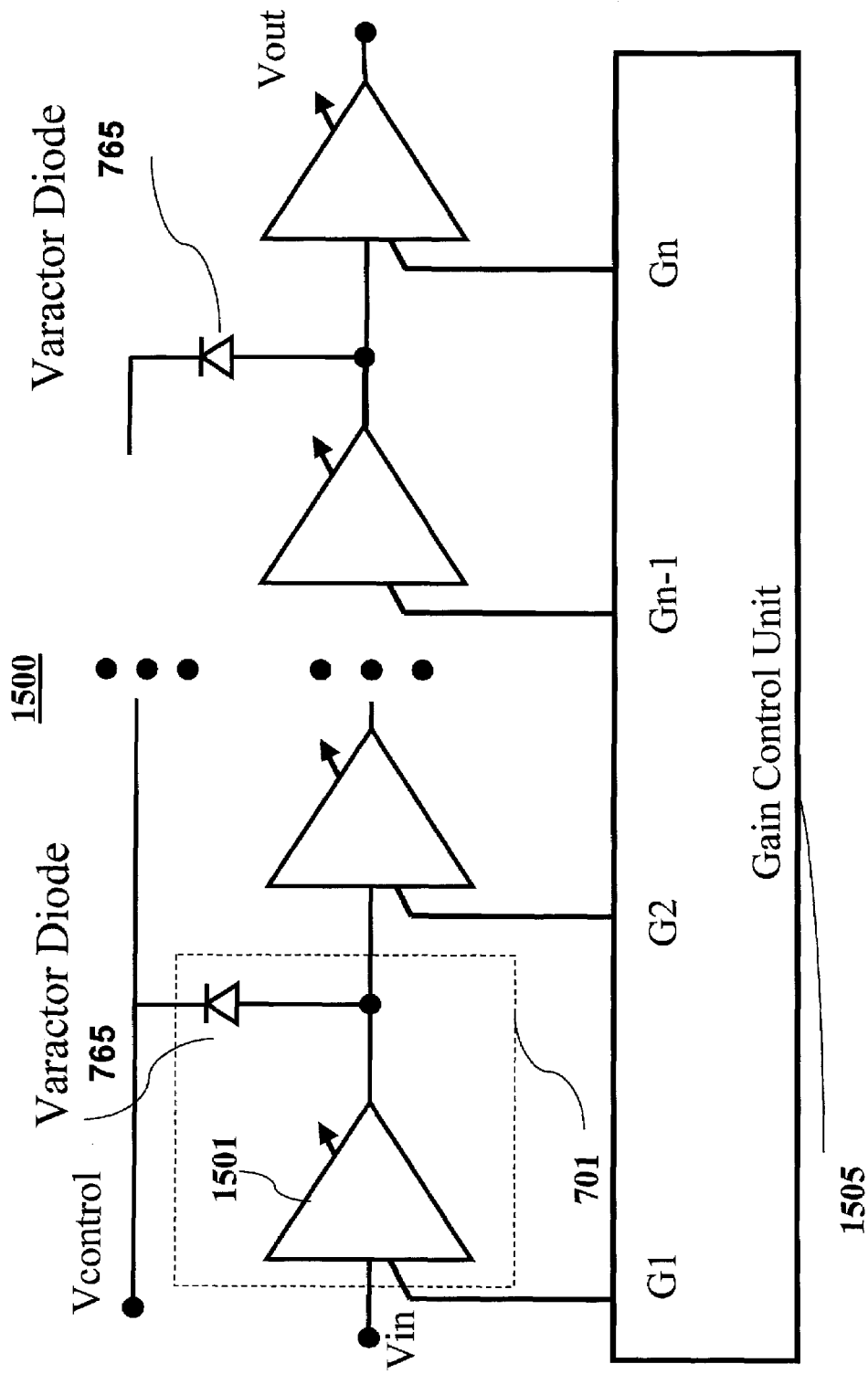
FIG. 15 is a schematic illustration of a distributed phase shifter including a plurality of the driving amplifier/variable capacitor stages of FIG. 7b.

A VCAPS phase shifter 1500 having a plurality of stages 701 is illustrated in FIG. 15. Each stage includes a linear transistor amplifier 1501 having an output node loaded by a varactor diode 765. For example, in the BJT-based stage 701 of FIG. 7b, linear transistor amplifier 1501 includes BJT transistors Q1 and Q2, inductors L1 and L2, blocking capacitor Cs and current source 760. Common control voltage Vcontrol controls the capacitance (and hence phase shift through each stage 701) of varactor diodes 765. The bias signal (such as Ib of FIG. 7b) controlling the gains of amplifiers 1501 is provided by a gain control unit 1505. Unit 1505 may provide an individual bias signal to each linear transistor amplifier. Alternatively, a common bias signal may be provided by unit 1501. Referring back to FIG. 3, VCAPS 1500 may be used to implement phase shifter 300. In such a WSAM embodiment, the control of Vcontrol and gain control unit 1505 may be subsumed by controller 190.

Although such a WSAM embodiment will achieve the linear analog phase shifts provided by VCAPS 1500, it will be appreciated that the benefits of VCAPS 1500 may be enjoyed by a variety of applications such as wireless communication involving, for example, high resolution M-ary coding or pulse position modulation (PPM)). It will thus be obvious to those skilled in the art that various changes and modifications may be made without departing from this invention in its broader aspects. The appended claims encompass all such changes and modifications as fall within the true spirit and scope of this invention.

I claim:

1. An integrated phase shifter, comprising:
a plurality of stages, wherein each stage includes:
a transistor amplifier configured to amplify a voltage signal received at an input node into an amplified voltage signal at an output node according to a gain, wherein the transistor amplifier is configured such that the gain is proportional to a bias signal;
an integrated inductor loading the output node, wherein the gain of the transistor amplifier is also proportional to an inductance of the integrated inductor; and
a varactor diode loading the output node, wherein the varactor diode has a variable capacitance responsive to a control voltage.

2. The integrated phase shifter of claim 1, wherein each transistor amplifier comprises bipolar transistors and wherein the bias signal comprises a bias current.

3. The integrated phase shifter of claim 1, wherein each transistor amplifier comprises field effect transistors and wherein the bias signal comprises a bias voltage.

4. The integrated phase shifter of claim 1, further comprising: a control unit configured to control the bias signals such an overall gain through the stages is constant despite a variation in the control voltage.

5. The integrated phase shifter of claim 2, wherein each transistor amplifier comprises a first bipolar transistor having an emitter coupled to a collector of a second bipolar transistor, and wherein the output node of the transistor amplifier couples to the emitter of the first bipolar transistor.

6. The integrated phase shifter of claim 5, wherein the input node of each transistor amplifier couples to a base of the second bipolar transistor through a DC blocking capacitor.

7. The integrated phase shifter of claim 6, wherein each DC blocking capacitor comprises metal layers in a semiconductor process used to form the integrated phase shifter.

8. The integrated phase shifter of claim 5, wherein the bias current is provided by a current source coupled to the base of the second bipolar transistor.

9. A method, comprising:
providing a phase shifter including a plurality of stages, wherein each stage includes a transistor amplifier configured to amplify a voltage signal received at an input node into an amplified voltage signal at an output node according to a gain, wherein the transistor amplifier is configured such that the gain is proportional to a bias signal; an integrated inductor loading the output node, wherein the gain of the transistor amplifier is also proportional to an inductance of the integrated inductor; and a varactor diode loading the output node, wherein the varactor diode has a variable capacitance responsive to a control voltage;
driving the input node of a first one of the stages with in input signal while varying a frequency of the input signal; and
determining the phase change and gain though each stage responsive to a plurality of values for the control voltage at the varied frequencies of the input signal; and
determining a pivot frequency for the input signal at which a maximum phase shift difference is achieved across the plurality of values of the control voltage and at which a minimal gain difference is achieved across the plurality of values of the control voltages.

* * * * *